(12) United States Patent
Machida

(10) Patent No.: US 8,274,153 B2
(45) Date of Patent: Sep. 25, 2012

(54) ELECTRONIC COMPONENT BUILT-IN WIRING SUBSTRATE

(75) Inventor: Yoshihiro Machida, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 169 days.

(21) Appl. No.: 12/820,546

(22) Filed: Jun. 22, 2010

(65) Prior Publication Data
US 2010/0320622 A1 Dec. 23, 2010

(30) Foreign Application Priority Data
Jun. 23, 2009 (JP) .................................. 2009-149041

(51) Int. Cl.
H01L 23/48 (2006.01)
H01L 23/52 (2006.01)
H01L 29/40 (2006.01)

(52) U.S. Cl. .......................... 257/773; 257/778; 438/108

(58) Field of Classification Search .................. 257/773, 257/778, E21.511, E23.023; 438/108
See application file for complete search history.

(56) References Cited

U.S. PATENT DOCUMENTS

| 7,872,359 | B2 * | 1/2011 | Inoue | 257/784 |
| 8,106,495 | B2 * | 1/2012 | Kajiki | 257/678 |
| 2005/0067715 | A1 * | 3/2005 | Sunohara | 257/778 |
| 2005/0206016 | A1 * | 9/2005 | Shohji et al. | 257/787 |
| 2010/0244228 | A1 * | 9/2010 | Sakata et al. | 257/692 |

FOREIGN PATENT DOCUMENTS

JP 2008-159955 7/2008

* cited by examiner

Primary Examiner — Phuc Dang
(74) Attorney, Agent, or Firm — Rankin, Hill & Clark LLP

(57) ABSTRACT

In an electronic component built-in wiring substrate, an electronic component is mounted on a first wiring substrate. A second wiring substrate is stacked on the first wiring substrate and is connected electrically to the first wiring substrate by connection terminals. The second wiring substrate has an opening portion of a size larger than a planar area of the electronic component. An underfill resin is filled in a first space between the first wiring substrate and the electronic component, and has a raised portion which is raised along an outer peripheral side surface of the electronic component, seals a clearance between an inner peripheral edge of the opening portion and an outer peripheral edge of the electronic component and supports the second wiring substrate. A sealing resin is filled in a second space between the first and second wiring substrates.

6 Claims, 9 Drawing Sheets

ELECTRONIC COMPONENT BUILT-IN WIRING SUBSTRATE

This application claims priority to Japanese Patent Application No. 2009-149041, filed Jun. 23, 2009, in the Japanese Patent Office. The Japanese Patent Application No. 2009-149041 is incorporated by reference in its entirety.

TECHNICAL FIELD

The present disclosure relates to an electronic component built-in wiring substrate and a method of manufacturing the same. More particularly, the present disclosure relates to an electronic component built-in wiring substrate in which an electronic component is mounted between a pair of wiring substrates and a method of manufacturing the same.

RELATED ART

FIG. 16 is a cross sectional view showing a state of an electronic component built-in wiring substrate 200 before a sealing resin is filled in the related art, which has been proposed in Patent Literature 1 as follows.

The electronic component built-in wiring substrate 200 is constructed in such a way that an electronic component 130 is mounted between a first wiring substrate 110 and a second wiring substrate 120, and that connection pads 112B formed on an upper surface of the first wiring substrate 110 and connection pads 122A formed on a lower surface of the second wiring substrate 120 are electrically connected via solder balls 150 with copper core as the connection terminals respectively.

[Patent Literature 1] JP-A-2008-159955

As shown in FIG. 17, in the electronic component built-in wiring substrate 200 shown in FIG. 16, a sealing resin 160 is filled into a space between the second wiring substrate 120 and the first wiring substrate 110 by using transfer molds 172, 174. At this time, as shown in FIG. 17, a portion of the second wiring substrate 120 adjacent to an opening portion 124 which is formed in the second wiring substrate 120 is deflected/deformed downward by a clamping force applied from the transfer molds 172, 174.

More specifically, no supporting member is provided at the portion of the second wiring substrate 120 adjacent to the opening portion 124, and the portion adjacent to the opening portion 124 is brought into an overhang state. As shown in FIG. 17, the sealing resin 160 is filled into the space between the first and second wiring substrates 110, 120 in a state that the downward deflecting deformation of the second wiring substrate 120 is caused. At that time, the sealing resin 160 may enter into a space formed between the transfer mold 172 and the opening portion 124. As a result, as shown in FIG. 18, connection pads 122B, which are formed on an upper surface of the second wiring substrate 120 and located in the positions adjacent to the opening portion 124, are contaminated with the sealing resin 160 that entered into a clearance between the transfer mold 172 and the upper surface of the second wiring substrate 120, and a problem arises that a production yield of the electronic component built-in wiring substrate 200 is decreased.

SUMMARY

Exemplary embodiments of the present invention provide an electronic component built-in wiring substrate and a method of manufacturing the same.

An electronic component built-in wiring substrate according to an exemplary embodiment of the invention comprises:

a first wiring substrate having a first surface and a second surface opposite to the first surface;

an electronic component, which is mounted on the first surface of the first wiring substrate and is connected to the first wiring substrate by flip-chip bonding;

an external connection terminal formed on the second surface of the first wiring substrate;

a second wiring substrate, which is stacked on the first wiring substrate and is connected electrically to the first wiring substrate by connection terminals, the second wiring substrate having an opening portion in a portion, which faces the electronic component, of the second wiring substrate, the opening portion having a size larger than a planar area of the electronic component, and a first resin including an underfill resin portion and a raised portion, the underfill resin portion being filled in a first space between the first wiring substrate and the electronic component, the raised portion being raised along an outer peripheral side surface of the electronic component, sealing a clearance between an inner peripheral edge of the opening portion and an outer peripheral edge of the electronic component and supporting the second wiring substrate; and a second resin which is filled in a second space between the first and second wiring substrates.

A method of manufacturing an electronic component built-in wiring substrate, according to an exemplary embodiment of the invention, comprises:

forming a first resin, which is filled in a first space between a first wiring substrate and an electronic component mounted and connected to the first wiring substrate by flip-chip bonding, is raised along an outer peripheral side surface of the electronic component, and protrudes from an upper surface of the electronic component;

stacking a second wiring substrate, which has an opening portion having a size larger than a planer area of the electronic component, on the first wiring substrate after forming the first resin so that the opening portion faces the electronic component formed on the first wiring substrate and the first resin seals a clearance between an inner peripheral edge of the opening portion and an outer peripheral edge of the electronic component and supports the second wiring substrate;

connecting electrically the second wiring substrate to the first wiring substrate by connection terminals; and filling a second resin in a second space between the first and second wiring substrates after stacking the second wiring substrate.

Further, a method of manufacturing an electronic component built-in wiring substrate, according to an exemplary embodiment of the invention, comprises:

forming a first resin which is filled in a first space between a first wiring substrate and an electronic component mounted and connected to the first wiring substrate by flip-chip bonding;

stacking a second wiring substrate, which has an opening portion having a size larger than a planer area of the electronic component, on the first wiring substrate so that the opening portion faces the electronic component formed on the first wiring substrate;

connecting electrically the second wiring substrate to the first wiring substrate by connection terminals;

forming a raised resin portion, which is raised along an outer peripheral side surface of the electronic component, seals a clearance between an inner peripheral edge of the opening portion and an outer peripheral edge of the electronic component, supports the second wiring substrate and protrudes from an upper surface of the electronic component, by providing a resin along an outer peripheral side surface of the electronic component after stacking the second wiring substrate; and filling a second resin in a second space between the first and second wiring substrates after forming the raised resin portion.

According to the electronic component built-in wiring substrate of the present invention, an intermediate structure of the electronic component built-in wiring substrate can be set in a transfer mold in a state that a clearance between the outer peripheral edge of the electronic component and the inner peripheral edge of the opening portion of the second wiring substrate is sealed and also the inner peripheral edge of the opening portion of the second wiring substrate is supported. Therefore, a situation that the deflecting deformation of the second wiring substrate is caused in the vicinity of the opening portion by a clamping force of the transfer mold can be prevented. As a result, when the sealing resin is filled into the space between the first wiring substrate and the second wiring substrate in the transfer mold, the sealing resin never enters into the upper surface of the second wiring substrate. In other words, the contamination of the connection pads provided to the upper surface of the second wiring substrate can be eliminated, and also a manufacturing yield of the electronic component built-in wiring substrate can be greatly improved.

Other features and advantages may be apparent from the following detailed description, the accompanying drawings and the claims.

DETAILED DESCRIPTION

First Embodiment

Figure 1:
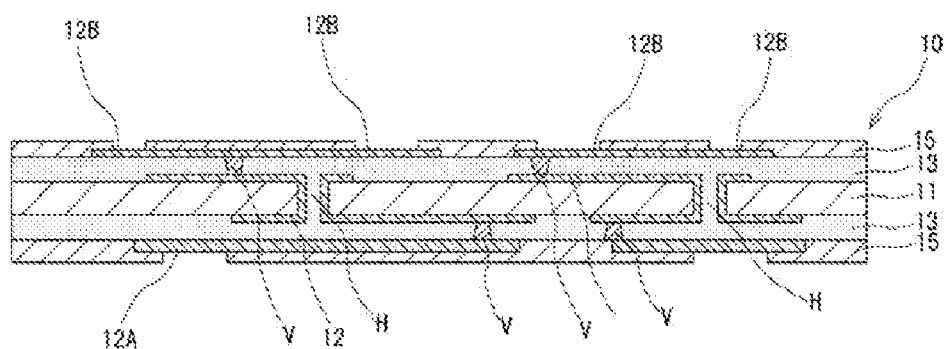
FIG. 1 is a sectional view showing a first wiring substrate according to a first embodiment of the invention.

Exemplary embodiments of a method of manufacturing an electronic component built-in wiring substrate according to the present invention will be explained with reference to the drawings hereinafter. First, as shown in FIG. 1, a first wiring substrate 10 is prepared. In the first wiring substrate 10, wiring patterns 12 are formed on upper and lower surfaces of a core substrate 11 by the publicly known method respectively. The core substrate 11 is formed of the insulating material. The wiring patterns 12 are made of conductor such as copper, or the like. In the present embodiment, the wiring pattern 12 is formed in plural layers on the surface of the core substrate 11.

An insulating resin 13 is stacked between the wiring patterns 12 located adjacent in the thickness direction of the first wiring substrate 10 respectively. The wiring patterns 12 located in the thickness direction (vertical direction) respectively are mutually electrically connected by vias V that are provided in the insulating resin 13.

Both the upper and lower surfaces of the first wiring substrate 10 are covered with a resist 15. Connection pads 12A, 12B are formed by removing a part of the resist 15 to expose the wiring pattern 12 respectively. The connection pads 12A and 12B (not shown) are formed on land portions of the multilayer structure in which the nickel plating process and the gold plating process are applied to surfaces of the wiring patterns 12. The connection pads 12A and 12B, which are formed on the lower and upper surfaces of the first wiring substrate 10 respectively, are connected electrically by the vias V, through holes H, and the wiring patterns 12.

Figure 2:
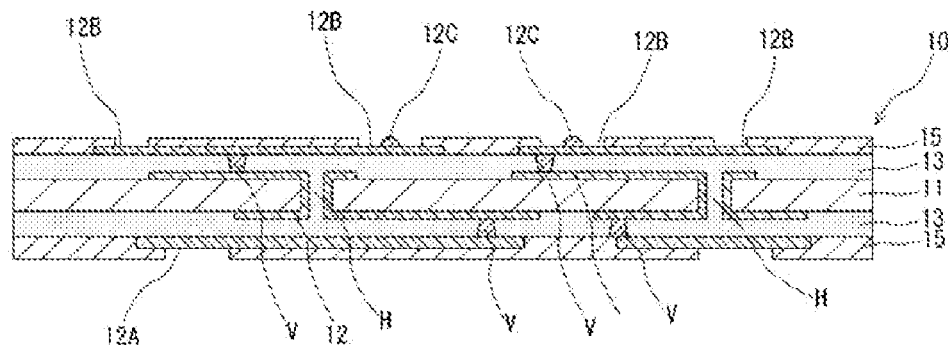
FIG. 2 is a sectional view showing a structure that solder bumps are formed on the first wiring substrate as shown in FIG. 1 at portions corresponding to connection pads of an electronic component.

Then, as shown in FIG. 2, solder bumps 12C are formed on the connection pads 12B, to which electrode terminals of a semiconductor element as an electronic component mounted on the upper surface of the first wiring substrate 10 are connected. The solder bumps 12C can make sure the joining of the connection pads of the first wiring substrate to the electrode terminals of the semiconductor element. The electrode terminals formed on the semiconductor element are formed of the metallic bumps such as gold bumps, or the like.

Figure 3:
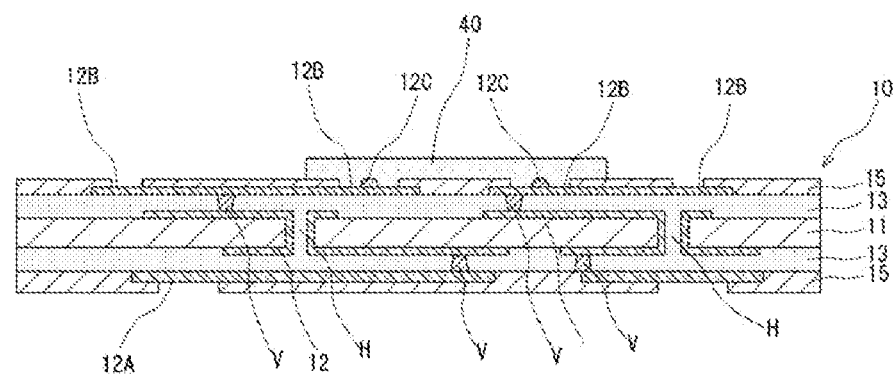
FIG. 3 is a sectional view showing a structure that a resin film is provided on the first wiring substrate as shown in FIG. 2 at an electronic component mounting position.

Then, as shown in FIG. 3, a resin film 40 made of an underfill resin is provided to a semiconductor element mounting position of the first wiring substrate 10 shown in FIG. 3. The resin film 40 is provided to fill in a space between the first wiring substrate 10 and the semiconductor element mounted thereon with the underfill resin. For this purpose, the resin film 40 has a size that is sufficient to cover a wider area than a planar area of the semiconductor element to be mounted. The solder bumps 12C formed previously are covered with the resin film 40.

Figure 4:
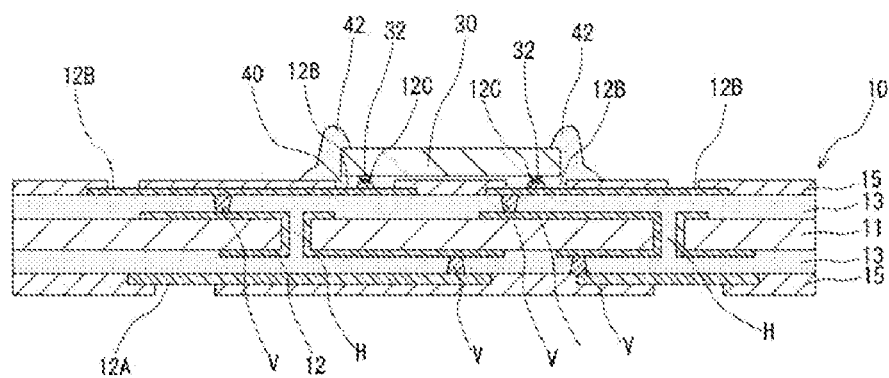
FIG. 4 is a sectional view showing a structure that a semiconductor element as the electronic component is mounted on the resin film formed on the first wiring substrate as shown in FIG. 3.

Then, as shown in FIG. 4, a semiconductor element 30 is mounted on the resin film 40. The semiconductor element 30 is mounted onto the first wiring substrate 10 in a state that the surface on which electrode terminals 32 are formed is opposed to the resin film 40 (flip-chip bonding). It is preferable that, upon mounting the semiconductor element 30 on the resin film 40, the first wiring substrate 10, the resin film 40, and the semiconductor element 30 should be heated respectively. The electrode terminals 32 passes through the resin film 40 that is softened by heating, then cuts into the solder bumps 12C, and then are connected electrically to the solder bumps 12C in terms of intermetallic bonding.

When the resin film 40 (underfill resin) softened by the heating is pressed by the semiconductor element 30, the resin film 40 creeps up along an outer peripheral side surface of the semiconductor element 30 to form a so-called raised portion 42, as shown in FIG. 4. In the present embodiment, when the raised portion 42 is pushed up by a pushing force applied at a time the semiconductor element 30 is mounted, the raised portion 42 protrudes up to an upper position beyond the upper surface (called the rear surface or the back surface) of the semiconductor element 30. Therefore, it is preferable that an amount of resin being filled into the space between the semiconductor element 30 and the first wiring substrate 10 and an amount of resin of the resin film 40 should be calculated in advance. The raised portion 42 formed in this manner can be kept in a semi-cured state when the heating is released after the mounting of the semiconductor element 30, and thus a height of the raised portion 42 formed once is never lowered.

Figure 5:
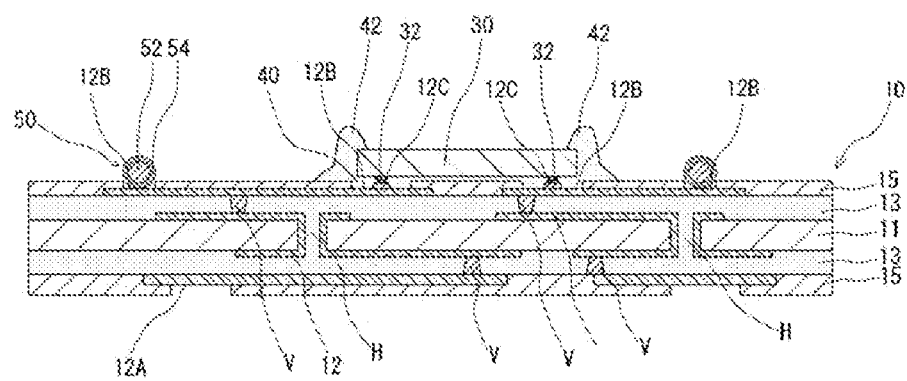
FIG. 5 is a sectional view showing a structure that solder balls are mounted on connection pads of the first wiring substrate as shown in FIG. 4.

Then, as shown in FIG. 5, solder balls 50 are mounted as the connection terminals on the connection pads 12B on the upper surface of the first wiring substrate 10. As the solder ball 50 used in the present embodiment, the ball whose outer peripheral surface of a core material 52 made of copper is coated with a solder paste 54 is employed. An interval between the first wiring substrate 10 and the second wiring substrate 20 can be specified in terms of a diameter dimension of the core material 52 made of copper. A diameter dimension of the core material 52 made of copper can be set adequately in response to a configuration of the electronic component built-in wiring substrate, while taking a thickness of the mounted semiconductor element 30 into consideration.

Figure 6:
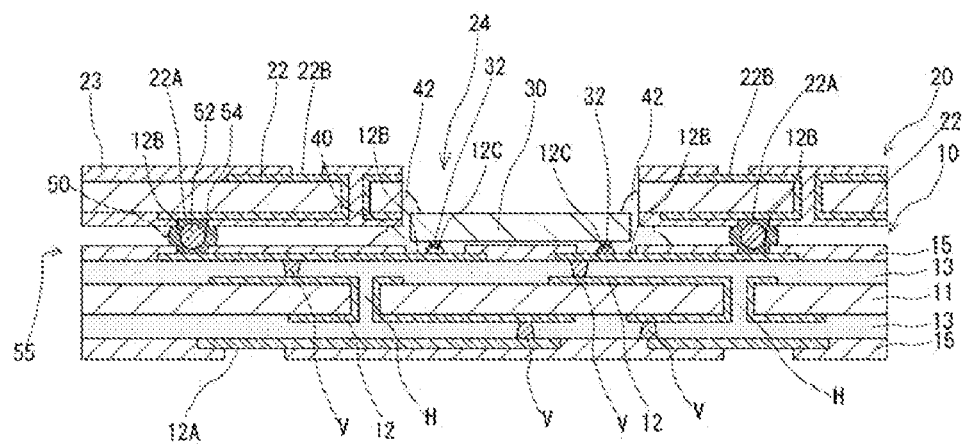
FIG. 6 is a sectional view showing an intermediate structure in which a second wiring substrate having an opening portion is stacked on the first wiring substrate as shown in FIG. 5.

As shown in FIG. 6, the second wiring substrate 20 is stacked after the solder balls 50 are fitted to the first wiring substrate 10. Like the first wiring substrate 10, wiring patterns 22 formed of conductor such as copper, or the like are also formed on the upper and lower surfaces of the second wiring substrate 20 respectively. That is, the surfaces of the second wiring substrate 20 are covered with a resist 23, and portions to which the connection terminals of the wiring patterns 22 are joined are exposed to constitute connection pads 22A, 22B. The wiring patterns 22 formed on both surfaces of the second wiring substrate 20 are connected electrically via the through holes. An opening portion 24 is formed in a portion, which corresponds to the mounting position of the semiconductor element 30, of the second wiring substrate 20. An inner peripheral position of the opening portion 24 is formed in a position that is located further outward than an outer peripheral position of the semiconductor element 30.

The second wiring substrate 20 is stacked on the first wiring substrate 10 such that positions of the connection pad 22A on the lower surface side are aligned with the positions of the solder balls 50. When the second wiring substrate 20 is stacked on the first wiring substrate 10 so as to align the connection pad 22A with the fitting positions of the solder balls 50, the semiconductor element 30 is housed in the opening portion 24 and surrounded by an inner peripheral surface of the opening portion 24. Upon connecting the second wiring substrate 20 to the solder balls 50 on the first wiring substrate 10, the position of the lower surface of the second wiring substrate 20 is located below the position of the upper end of the raised portion 42.

Therefore, the second wiring substrate 20 is stacked in a state that an inner peripheral edge of the opening portion 24 on the lower surface side cuts into the raised portion 42, and the inner peripheral edge of the opening portion 24 and its surrounding area are supported over a predetermined range by the raised portion 42. An intermediate structure 55 is obtained in which a clearance between the inner peripheral edge of the opening portion 24 on the lower surface side and the outer peripheral edge of the semiconductor element 30 on the upper surface side is sealed with a part of the raised portion 42. In this manner, the raised portion 42 formed by a part of the resin film 40 used as the underfill resin functions as the supporting portion.

Figure 7:
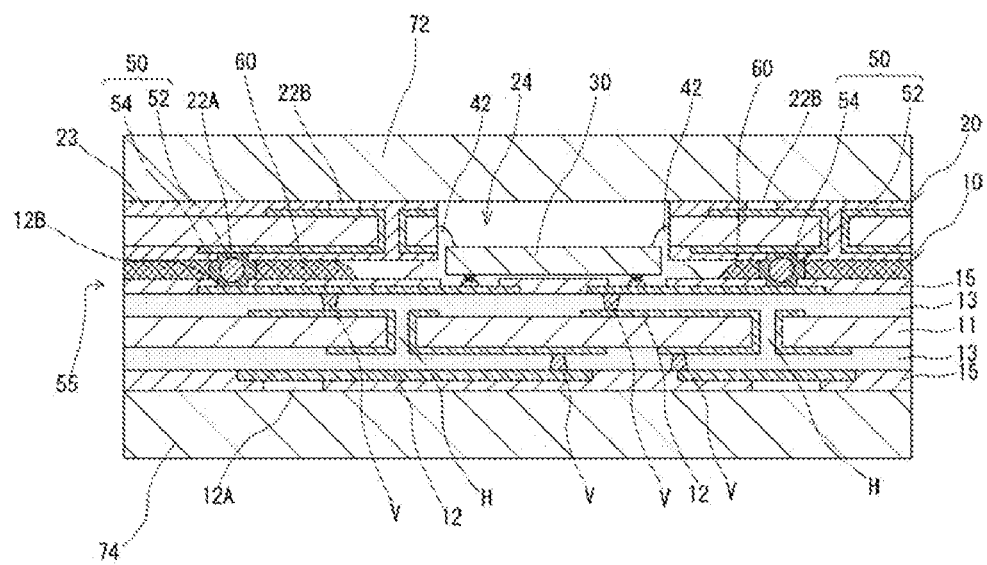
FIG. 7 is a sectional view showing a state that a sealing resin is filled into a space between the first and second wiring substrates of the intermediate structure as shown in FIG. 6 by using a transfer mold.

Then, as shown in FIG. 7, the intermediate structure 55 is set between an upper mold 72 and a lower mold 74 of the transfer mold (referred simply to as the "upper mold 72" and the "lower mold 74" hereinafter). Then, a sealing resin 60 is filled in the space between the first wiring substrate 10 and the sealing resin 60 of the intermediate structure 55. At this time, it is similar to the related art that the intermediate structure 55 is pressed vertically by the upper mold 72 and the lower mold 74. The solder paste 54 on an outer surface of the solder ball 50 is fused by heat from the upper mold 72 and the lower mold 74, and therefore the interval between the first wiring substrate 10 and the second wiring substrate 20 is specified by a diameter dimension of the core material 52 made of copper.

As apparent from FIG. 7, the inner peripheral edge of the opening portion 24 on the lower surface side of the second wiring substrate 20 is sealed and supported by the raised portion 42 of the resin film 40 used as the underfill resin of the semiconductor element 30. That is, even in filling the sealing resin 60 by using the upper mold 72 and the lower mold 74, the second wiring substrate 20 is never deflected downward in the neighboring position of the opening portion 24, and the first wiring substrate 10 and the second wiring substrate 20 can be held in a parallel stacked state. Accordingly, no clearance is produced between the lower surface of the upper mold 72 and the upper surface of the second wiring substrate 20. Therefore, the situation that the sealing resin 60 enters into the upper surface side of the second wiring substrate 20 (the occurrence of the so-called "flash") can be prevented, and the sealing resin 60 can be filled adequately.

After the filling of the sealing resin 60 into the space between the first wiring substrate 10 and the second wiring substrate 20 of the intermediate structure 55 is finished, an electronic component built-in wiring substrate 100 according to the present invention may be obtained. The electronic component built-in wiring substrate (for example, the second wiring substrate 20) obtained in this manner may possess such advantages that a degree of flatness of the upper surface is high and a positioning precision of the connection pads 22B can be improved.

Then, the electronic component built-in wiring substrate 100 is taken out from the upper mold 72 and the lower mold 74. This electronic component built-in wiring substrate 100 corresponds to an embodiment of the electronic component built-in wiring substrate according to the present invention. A sectional view of such electronic component built-in wiring substrate 100 is shown in FIG. 8.

Figure 8:
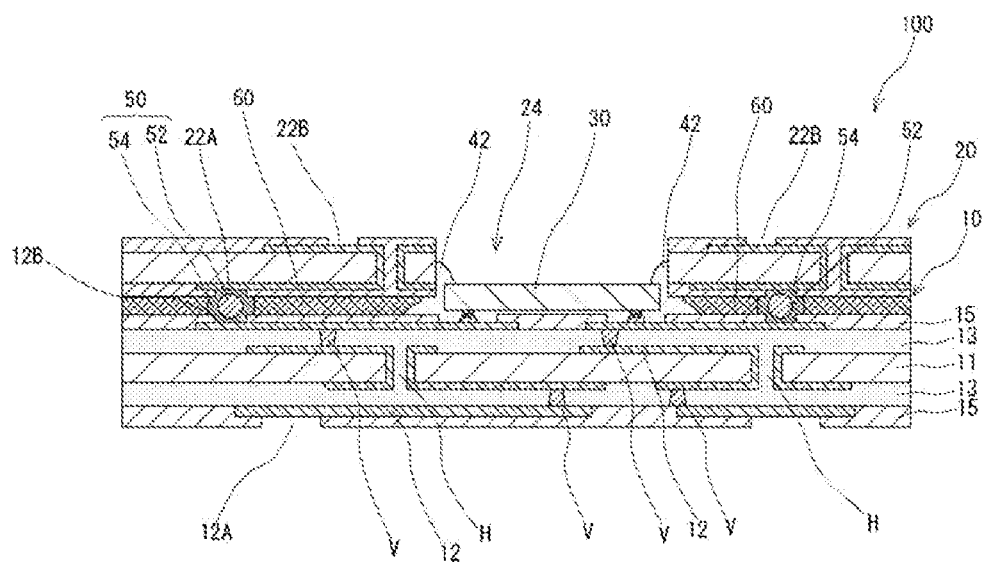
FIG. 8 is a sectional view showing an electronic component built-in wiring substrate taken out from the transfer mold.

As shown in FIG. 8, in the electronic component built-in wiring substrate 100, the first wiring substrate 10 and the second wiring substrate 20 are connected electrically via the solder balls 50 as the connection terminals and are stacked mutually. The semiconductor element 30 as the electronic component is mounted on the first wiring substrate 10, while the opening portion 24 having a size that can contain the semiconductor element 30 therein is formed in the portion corresponding to the semiconductor element 30 of the second wiring substrate 20.

Then, the raised portion 42 is formed by a part of the resin film 40 that is formed of the underfill resin filled in the space between the semiconductor element 30 and the first wiring substrate 10. A clearance between the outer peripheral edge of the semiconductor element 30 on the upper surface side and the inner peripheral edge of the opening portion 24 on the lower surface side is sealed with the raised portion 42. Further, the inner peripheral edge of the opening portion 24 is supported over a predetermined range by the raised portion 42.

The sealing resin 60 is filled in the space between the first wiring substrate 10 and the second wiring substrate 20. The sealing resin 60 is filled only in the outer area than the outer surface of a part of the raised portion 42 (fillet portion) formed on the outer peripheral side surface of the semiconductor element 30.

The connection pad 22B formed in the neighboring area of the opening portion 24 on the upper surface of the second wiring substrate 20 as well as the planar area of the opening portion 24, are kept in a clean state in the same way as the state that the transfer molding is applied. In this manner, a direct contact between the semiconductor element 30 and the sealing resin 60 is avoided. Therefore, this configuration is also advantageous from such a point that the contact failure between the semiconductor element 30 as the inorganic matter and the sealing resin 60 as the organic matter can be avoided.

For the sealing resin 60, for example, an epoxy-based resin in which the content of filler ($SiO_2$) in the resin is about 80 to 90 wt % can be used. Further, an epoxy-based resin can be also used for the film resin (underfill resin) 40. However, the epoxy-based resin used for the film resin 40 contains a filler ($SiO_2$) whose content in the resin is about 50 to 60 wt % and whose particle diameter is smaller than that of the sealing resin 60, and its viscosity is lower than that of the sealing resin 60 and its flowability is higher than that of the sealing resin 60 when it is heated.

Figure 9:
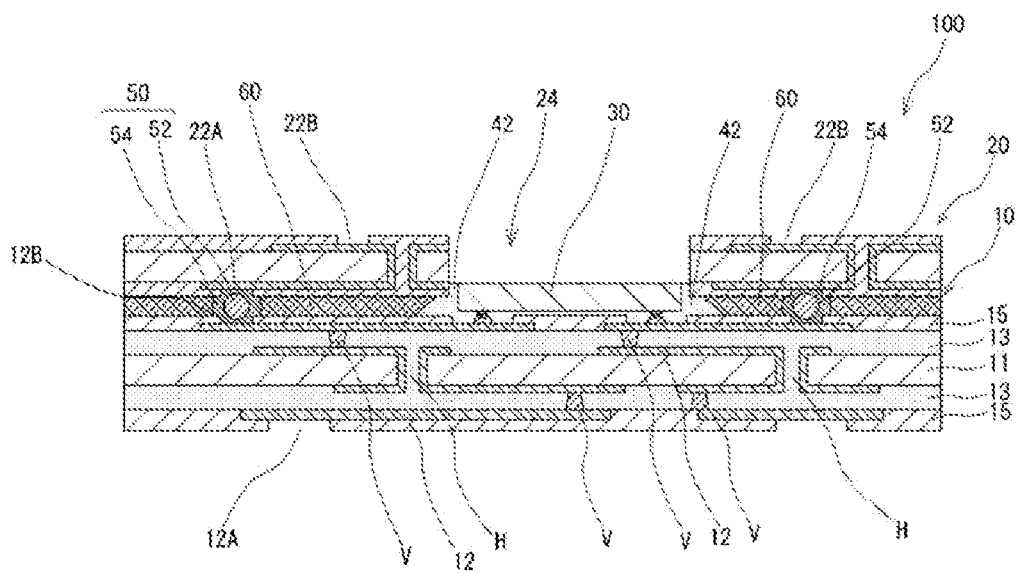
FIG. 9 is a sectional view showing a structure that a part of the raised portion is removed in the electronic component built-in wiring substrate as shown in FIG. 8.

In the present embodiment, apart of the raised portion 42 that gets into the area on the upper surface of the semiconductor element 30 of the electronic component built-in wiring substrate 100 is removed by the dry etching, or the like. In more detail, the raised portion 42 and the upper surface of the semiconductor element 30 constitute a coplanar surface, and expose the whole upper surface of the semiconductor element 30, as shown in FIG. 9. However, when the upper surface of the semiconductor element 30 may be kept as a space used as a free area, the removing process of the raised portion 42 can be of course omitted.

Figure 10:
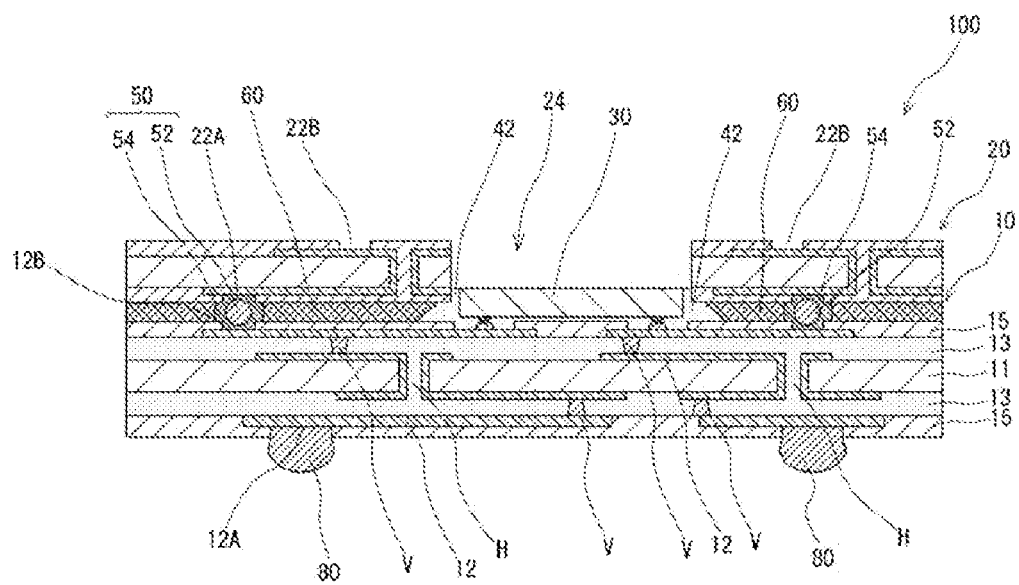
FIG. 10 is a sectional view showing a structure that external connection terminals are formed on the first wiring substrate of the electronic component built-in wiring substrate as shown in FIG. 9.

Then, as shown in FIG. 10, a solder bump 80 is fitted to the connection pads 12A, which are formed as the external connection terminals on the lower surface side of the first wiring substrate 10 (the electronic component built-in wiring substrate 100), respectively. Further, when a silicon sheet containing the graphite, although not shown, is pasted onto the upper surface of the semiconductor element 30 as the heat radiating plate (heat radiating sheet), a heat radiating efficiency of the semiconductor element 30 is improved. This structure is particularly preferable to the electronic component built-in wiring substrate 100 in which the heat tends to accumulate easily. The fitting of the solder bumps 80 and the pasting of the silicon sheet containing the graphite are omitted in some cases.

Second Embodiment

Figure 11:
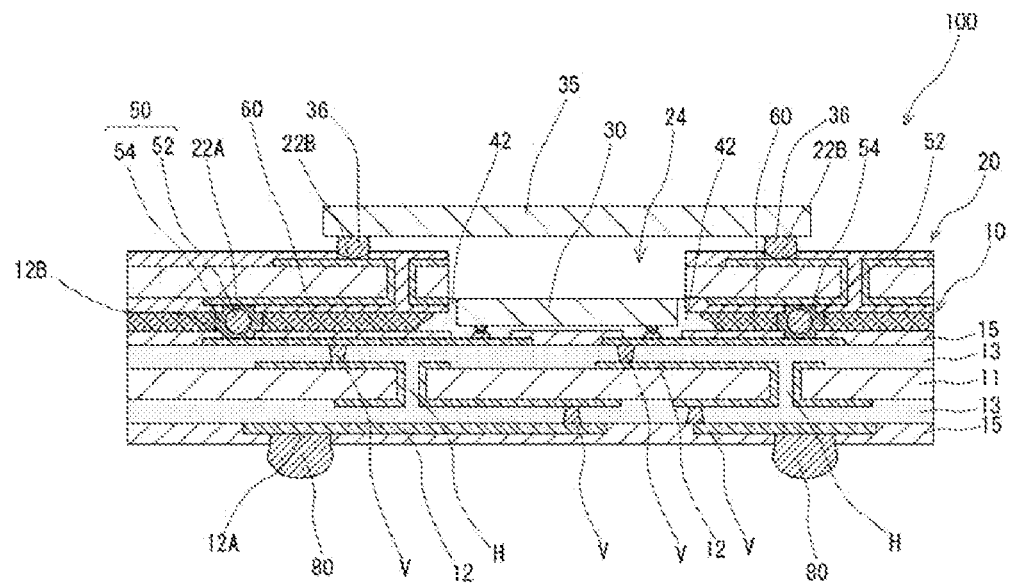
FIG. 11 is a sectional view showing an electronic component built-in wiring substrate according to a second embodiment of the invention.

Next, a second embodiment will be explained hereunder. FIG. 11 is a cross sectional view showing a configuration in the second embodiment of the electronic component built-in wiring substrate 100 according to the present invention. In the present invention, so-called surface-mounted component 35 such as a memory, or the like is mounted on the upper surface of the semiconductor element 30 (the upper surface of the second wiring substrate 20) of the electronic component built-in wiring substrate 100 explained in the first embodiment. In the electronic component built-in wiring substrate 100 according to an embodiment of the present invention, the sealing resin 60 is filled in a state that the second wiring substrate 20 is never deflected/deformed downward around the opening portion 24, and therefore a degree of flatness of the upper surface of the electronic component built-in wiring substrate 100 can be enhanced. As a result, external connection terminals 36 of the surface-mounted component 35 can be fitted onto the connection pads 22B of the second wiring substrate 20 with very high positional precision.

The same reference numerals as those of the reference numerals used in the first embodiment are affixed to the remaining structures, and their detailed explanation will be omitted herein. In FIG. 11, the solder bumps 80 as the external connection terminals are fitted to the connection pads 12A formed on the first wiring substrate 10 of the electronic component built-in wiring substrate 100. Alternatively, the mode in which the solder bumps 80 are not fitted may also be employed.

Third Embodiment

Figure 12:
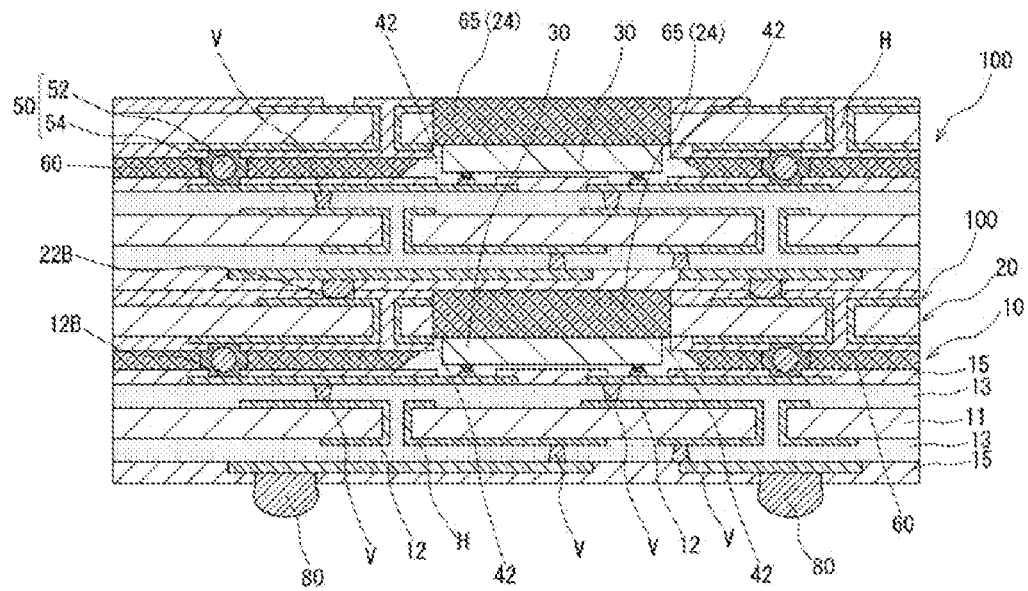
FIG. 12 is a sectional view showing an electronic component built-in wiring substrate according to a third embodiment of the invention.

Next, a third embodiment will be explained hereunder. FIG. 12 is a cross sectional view showing a configuration in the third embodiment of the electronic component built-in wiring substrate according to the present invention. Concretely, the so-called PoP (Package on Package) structure is constructed by filling a synthetic resin 65 into a space, which is formed by the opening portion 24 in the electronic component built-in wiring substrate (semiconductor device) 100 explained in the first embodiment, to planarize the upper surface of the electronic component built-in wiring substrate 100, and then mounting another electronic component built-in wiring substrate 100 on the flat upper surface. In filling the synthetic resin 65 of the electronic component built-in wiring substrate 100 on the lower surface side, the transfer mold (not shown herein) can be employed.

At this time, the second wiring substrate 20 is supported by the raised portion 42 and the sealing resin 60 over the whole planar area except the opening portion 24. Therefore, such a situation is never caused that the second wiring substrate 20 is deflected/deformed downward in vicinity of the opening portion 24. As a result, in the resin molding step, a clearance is not generated between the lower surface of the upper mold 72 and the upper surface of the second wiring substrate 20, and thus the synthetic resin 65 never enters into the connection pads 22B formed on the upper surface of the second wiring substrate 20 from the opening portion 24, so that the contamination of the connection pads 22B formed on the upper surface of the second wiring substrate 20 is not caused. In this mode, it is similar to the above embodiments that the fitting of the solder bumps 80 onto the first wiring substrate 10 of the electronic component built-in wiring substrate 100 in the lowermost layer may be omitted.

Fourth Embodiment

In the present embodiment, an embodiment in which an underfill resin 45 is filled when the semiconductor element 30 is mounted on the first wiring substrate 10, like the related art, will be explained hereunder.

Figure 13:
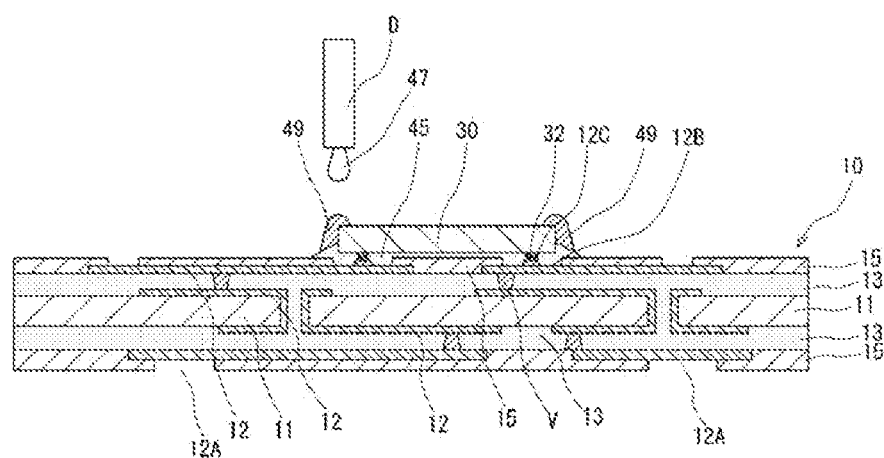
FIG. 13 is a sectional view showing an electronic component built-in wiring substrate according to a fourth embodiment of the invention.

The solder bumps 12C are formed on the connection pads 12B of the first wiring substrate 10, and then the electrode terminals 32 of the semiconductor element 30 are opposed to the solder bumps 12C and are joined thereto (flip-chip bonding). In order to protect the intermetallic bonding between the electrode terminals 32 made of gold and the solder bumps 12C, the underfill resin 45 is filled in a space between the first wiring substrate 10 and the semiconductor element 30 by the publicly known method. The publicly known method can be applied to the steps applied until now, and therefore their illustration will be omitted herein. After the underfill resin 45 is cured, a thermosetting synthetic resin 47 such as an epoxy resin, or the like is fed to the outer peripheral side surface of the semiconductor element 30 (fillet portion of the underfill resin 45) and the upper surface of the semiconductor element 30 by a dispenser D shown in FIG. 13. Thus, a raised portion 49 that is raised along the outer peripheral side surface of the semiconductor element 30 is formed. A shape feature and a functional feature of the raised portion 49 are similar to the raised portion 42 that is caused by the deformation of the resin film 40 in the first embodiment.

Figure 14:
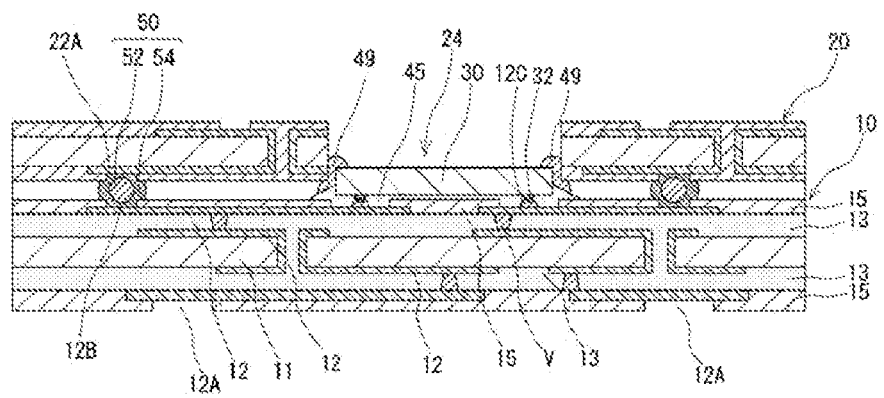
FIG. 14 is a sectional view showing a manufacturing process of the electronic component built-in wiring substrate according to the fourth embodiment of the invention.

In this manner, the semi-cured raised portion 49 that protrudes from the outer peripheral side surface and the upper surface of the semiconductor element 30 is formed. Then, like the first embodiment, the solder balls 50, the outer surface of the core material 52 of which is covered with the solder paste 54, are fitted onto the connection pads 12B on the upper surface of the first wiring substrate 10, and then the connection pads 22A formed on the lower surface of the second wiring substrate 20 are aligned with the positions of the solder balls 50 and are stacked. Thus, the structure is brought into a state shown in FIG. 14. As shown in FIG. 14, according to the present embodiment, such a state can be formed that a clearance between the semiconductor element 30 and the opening portion 24 formed on the second wiring substrate 20 is sealed with the raised portion 49. In other words, the second wiring substrate 20 can be supported by not only the solder balls 50 but also a part of the raised portion 49 at the outer peripheral portion of the semiconductor element 30 that is housed in the opening portion 24.

In filling the sealing resin 60 into the space between the first wiring substrate 10 and the second wiring substrate 20 of the electronic component built-in wiring substrate 100 (semiconductor device) obtained in this manner, like the first embodiment, the sealing resin 60 can be filled by using the transfer mold. In the electronic component built-in wiring substrate 100 in the present embodiment, the inner peripheral edge of the opening portion 24 of the second wiring substrate 20 is also supported over a predetermined range by the raised portion 49. Therefore, even though a clamping force of the transfer mold operates, the portion of the second wiring substrate 20 located around the opening portion 24 is never deflected downward.

Figure 15:
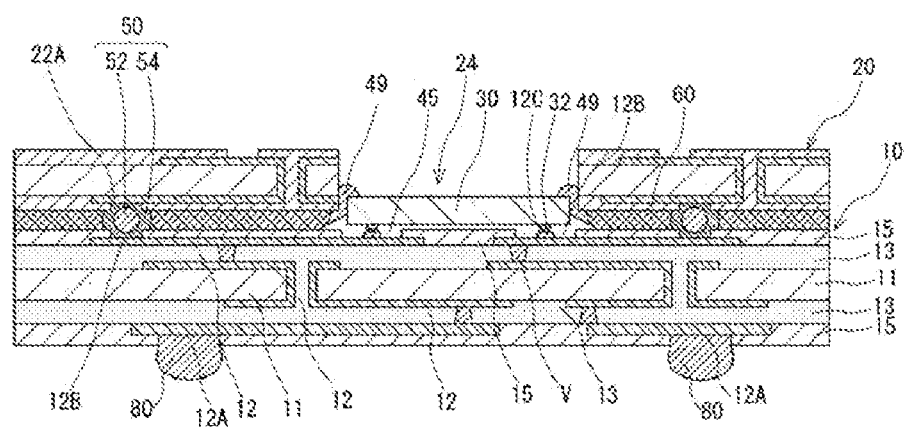
FIG. 15 is a sectional view showing a manufacturing process of the electronic component built-in wiring substrate according to the fourth embodiment of the invention.
Figure 16:
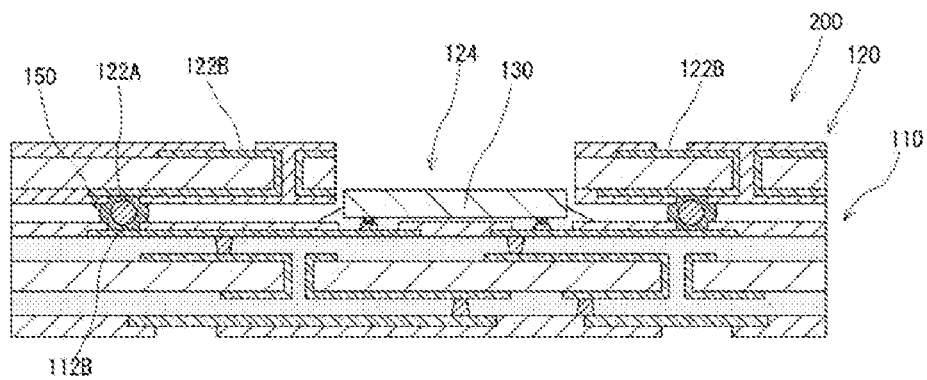
FIG. 16 is a sectional view showing a structure of an electronic component built-in wiring substrate before filling a sealing resin in a related art.
Figure 17:
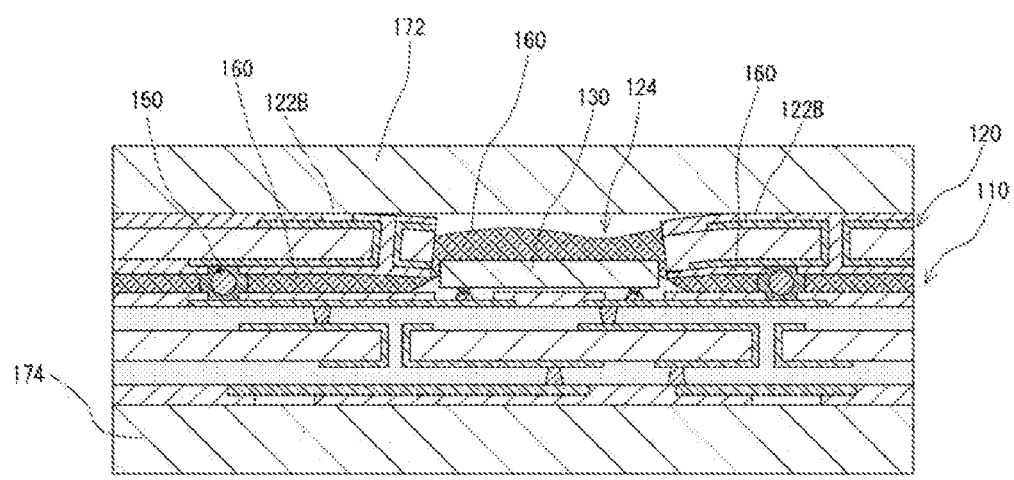
FIG. 17 is a sectional view showing a state that the sealing resin is filled in the electronic component built-in wiring substrate as shown in FIG. 16 by using a transfer mold.
Figure 18:
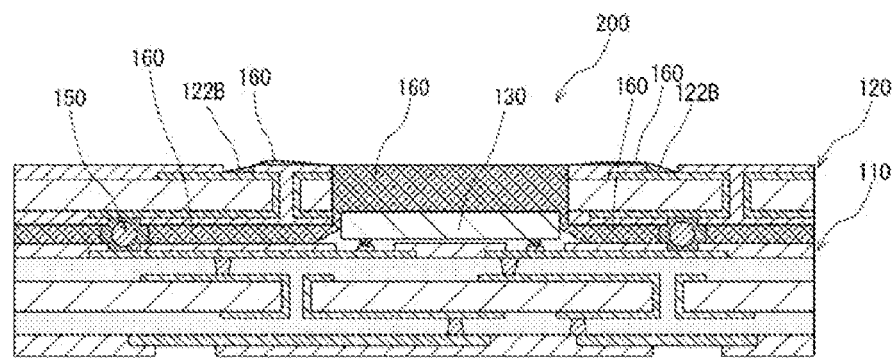
FIG. 18 is a sectional view showing a state that the electronic component built-in wiring substrate as shown in FIG. 17 is taken out from the transfer mold.

Therefore, the electronic component built-in wiring substrate 100 in the present embodiment can also have a similar finished profile to the electronic component built-in wiring substrate 100 in the first embodiment. Also, as occasion demands, as shown in FIG. 15, the solder bumps 80 can be fitted to the connection pads 12A, which are formed on the lower surface of the electronic component built-in wiring substrate 100 (the lower surface of the first wiring substrate 10), as the external connection terminals.

However, when the present embodiment is employed, the raised portion 49 similar to the raised portion 42 in the first embodiment can be formed; nevertheless the number of steps is increased by one step in contrast to the first embodiment.

With the above, the electronic component built-in wiring substrate 100 (semiconductor device) according to the present invention is explained in detail based on the embodiments. But the invention of this application is not limited to the above embodiments. It is needless to say that various variations and modifications, which are made within a scope not to change a gist of the invention, belong to the technical scope of the invention of this application.

For instance, in the above embodiments, the semiconductor device is explained as the electronic component 30 by way of example. But the electronic component is not limited to the semiconductor device 30, and other electronic components may be employed.

Also, in the first embodiment, as the underfill resin constituting the raised portion 42 acting as the supporting portion, the resin film 40 formed of the underfill resin is employed. But the underfill resin is not limited to this mode. As another embodiment of the resin film 40, for example, NCF (Non Conductive Film), anisotropic conductive film, or the like may be employed.

Further, a mode of the underfill resin is not limited to a film-like shape. As another supply mode of the underfill resin, for example, such a mode may be employed that, before the semiconductor device 30 as the electronic component is mounted on the first wiring substrate 10, a liquid or gel underfill resin is fed by the dispenser. In this case, in mounting the semiconductor device 30 onto the underfill resin, the raised portion 42 acting as the supporting portion can be formed by utilizing the action of creeping-up of the underfill resin, which is caused along the outer peripheral side surface of the semiconductor device 30 when this underfill resin is pressed by the semiconductor device 30.

Also, in the above embodiments, the copper core material 52 is employed as the core material in the solder ball 50 employed as the connection terminal. The solder ball 50 whose core material 52 is formed of any conductor such as metal except copper, or other material (e.g., synthetic resin) may be employed if such conductor has a softening temperature that is sufficiently higher than a melting temperature of the solder.

Also, in the fourth embodiment, such a mode is explained that, prior to the stacking of the second wiring substrate 20, the raised portion 49, which protrudes from the upper surface of the semiconductor element 30 along the outer peripheral side surface of the semiconductor element 30, is formed by supplying the synthetic resin by means of the dispenser. But the formation of the raised portion 49 is not limited to this mode. The semiconductor element 30 may be mounted on the first wiring substrate 10, then the underfill resin 45 may be filled, then the second wiring substrate 20 having the opening portion 24 may be stacked, and then the synthetic resin may be fed to the clearance between the opening portion 24 and the outer peripheral side surface of the semiconductor element 30 by the dispenser D. According to this mode, the entering of the sealing resin 60 through the clearance between the semiconductor element 30 and the opening portion 24 can also be prevented, and also the neighboring area of the inner peripheral edge of the opening portion 24 can be supported in filling the sealing resin 60.

Also, in the above embodiments, the mode in which the back surface (the upper surface in Figures) of the semiconductor element 30 is positioned within a thickness of the second wiring substrate 20 is explained. In the state that the semiconductor element 30 is mounted, either the back surface of the semiconductor element 30 may be protruded beyond the upper surface of the second wiring substrate 20 or the upper surface (rear surface) of the semiconductor element 30 may be positioned at a height that is equal to a height of the lower surface of the second wiring substrate 20.

Further, it is of course that respective embodiments in which the above-explained embodiments are combined appropriately are also contained in the technical scope of the invention of this application.

What is claimed is:

1. An electronic component built-in wiring substrate comprising:
    a first wiring substrate having a first surface and a second surface opposite to the first surface;
    an electronic component, which is mounted on the first surface of the first wiring substrate and is connected to the first wiring substrate by flip-chip bonding;
    an external connection terminal formed on the second surface of the first wiring substrate;
    a second wiring substrate, which is stacked on the first wiring substrate and is connected electrically to the first wiring substrate by connection terminals, the second wiring substrate having an opening portion in a portion, which faces the electronic component, of the second wiring substrate, the opening portion having a size larger than a planar area of the electronic component, and
    a first resin including an underfill resin portion and a raised portion, the underfill resin portion being filled in a first space between the first wiring substrate and the electronic component, the raised portion being raised along an outer peripheral side surface of the electronic component, sealing a clearance between an inner peripheral edge of the opening portion and an outer peripheral edge of the electronic component and supporting the second wiring substrate, wherein the raised portion of the first resin directly contacts the outer peripheral side surface of the electronic component and the inner peripheral edge of the opening portion; and
    a second resin which is filled in a second space between the first and second wiring substrates.

2. The electronic component built-in wiring substrate according to claim 1, wherein the raised portion of the first resin seals the clearance between the inner peripheral edge on a lower surface side of the opening portion and the outer peripheral edge on an upper surface side of the electronic component.

3. The electronic component built-in wiring substrate according to claim 1, wherein the underfill resin portion and the raised portion are formed of different resin materials.

4. The electronic component built-in wiring substrate according to claim 1, wherein the connection terminals are solder balls, each having a metal core material and a solder coating an outer surface of the metal core material.

5. The electronic component built-in wiring substrate according to claim 1, wherein another electronic component is mounted on an upper surface of the second wiring substrate and is positioned above the opening portion of the second wiring substrate.

6. The electronic component built-in wiring substrate according to claim 1, wherein an upper surface of the first resin and an upper surface of the electronic component constitute a coplanar surface.

* * * * *